US006428940B1

(12) United States Patent
Sandstrom

(10) Patent No.: US 6,428,940 B1
(45) Date of Patent: Aug. 6, 2002

(54) METHOD FOR PATTERN GENERATION WITH IMPROVED IMAGE QUALITY

(75) Inventor: Torbjorn Sandstrom, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 09/623,194

(22) PCT Filed: Mar. 2, 1999

(86) PCT No.: PCT/SE99/00296

§ 371 (c)(1),
(2), (4) Date: Aug. 29, 2000

(87) PCT Pub. No.: WO99/45438

PCT Pub. Date: Sep. 10, 1999

(30) Foreign Application Priority Data

Mar. 2, 1998 (SE) .............................................. 9800665

(51) Int. Cl.[7] .............................. G03F 9/00; G03C 5/00
(52) U.S. Cl. ............................ 430/22; 430/30; 430/311
(58) Field of Search .............................. 430/22, 30, 311

(56) References Cited

U.S. PATENT DOCUMENTS 5,148,157 A 9/1992 Florence ..................... 340/783
5,495,279 A 2/1996 Sandstrom .................. 347/258
5,539,567 A 7/1996 Lin et al. .................... 359/281
5,614,990 A 3/1997 Bruce et al. .................. 355/71

FOREIGN PATENT DOCUMENTS

EP 0467076 B1 1/1992
WO WO9309469 A1 5/1993

OTHER PUBLICATIONS

Chen et al., "Experimental Comparison of Off–Axis Illumination and Imaging Interferometric Lithography," *SPIE*, Mar. 1999, pp. 736–744, vol. 3679, Santa Clara, California.

*Primary Examiner*—Christopher G. Young
(74) *Attorney, Agent, or Firm*—Birch, Stewart Kolasch & Birch, LLP

(57) ABSTRACT

The present invention relates to a method for creating a microlithographic pattern on a workpiece, for increased resolution and image fidelity. The method comprises the steps of: providing a source for emitting electromagnetic radiation, illuminating by said radiation a spatial light modulator (SLM) having several pixels, projecting an image of the modulator on the workpiece, further coordinating the movement of the workpiece, the feeding of the signals to the modulator and the intensity of the radiation, so that said pattern is stitched together from the partial images created by the sequence of partial patterns, where an area of the pattern is exposed at least twice with a change in at least one, and preferably at least two, of the following parameters between the exposures: data driven to the SLM, focus, angular distribution of the illumination at the SLM, pupil filtering, polarisation.

14 Claims, 9 Drawing Sheets

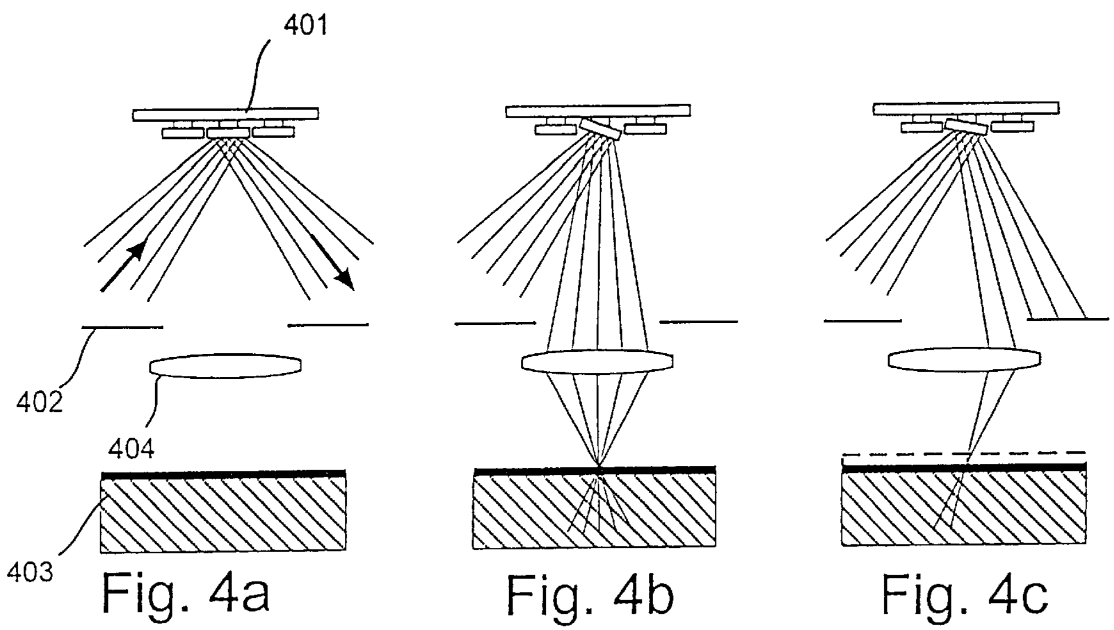
Fig. 4a Fig. 4b Fig. 4c
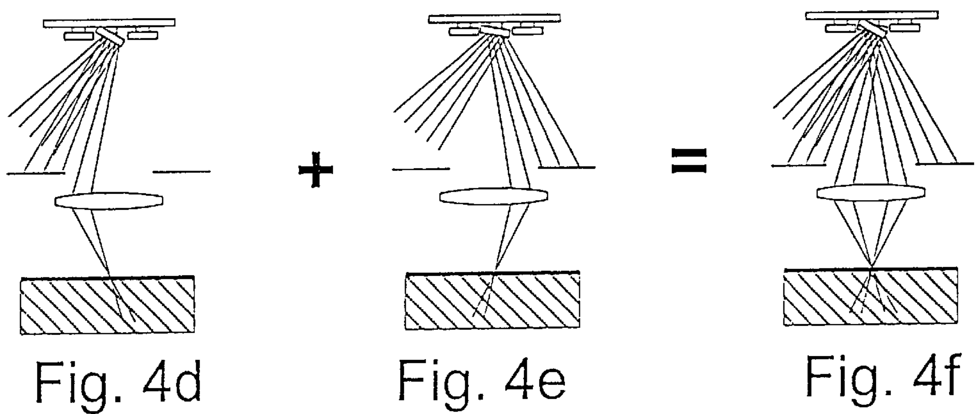
Fig. 4d Fig. 4e Fig. 4f
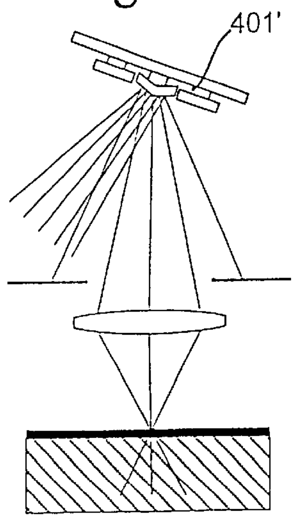
Fig. 4g
Fig. 4

METHOD FOR PATTERN GENERATION WITH IMPROVED IMAGE QUALITY

This application is the national phase under 35 U.S.C. §371 of PCT International Application No. PCT/SE99/00296 which has an International filing date of Mar. 2, 1999, which designated the United States of America.

BACKGROUND OF THE INVENTION

1. Field of the Invention

The present invention relates to printing of patterns with extremely high precision on photosensitive surfaces, such as photomasks for semiconductor devices and displays. It also relates to direct writing of semiconductor device patterns, display panels, integrated optical devices and electronic interconnect structures. Furthermore, it can have applications to other types of precision printing such as security printing. The term printing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared (IR) to extreme UV. Of special importance is the ultraviolet range from 370 nm (UV) through deep ultraviolet (DUV), vacuum ultraviolet (WV) and extreme ultraviolet (EUV) down to a few manometers wavelength. EUV is in this application defined as the range from 100 nm and down as far as the radiation is possible to treat as light. A typical wavelength for EUV is 13 nm. IR is defined as 780 nm up to about 20 $\mu$m.

In a different sense the present invention relates to the art and science of spatial light modulators and projection displays and printers using such modulators. In particular it improves the gray-scale properties, the image stability through focus and image uniformity and the data processing for such modulators by application of analog modulation technique. The most important use of the analog modulation is to generate an image in a high-contrast material such as photoresist with an address grid, i.e., the increment by which the position of an edge in the pattern is specified, that is much finer than the grid created by the pixels of the spatial light modulator.

2. Description of Background Art

Precision pattern generators using projection of micromirror spatial light modulators (SLMs) of the micromirror type are known in the art (Nelson, U.S. Pat. No. 5,148,157, 1988; Kück, EP 0 610 183, 1990). The use of an SLM in a pattern generator has a number of advantages compared to the more wide-spread method of using scanning laser spots. Since an SLM is a massively parallel device, and the number of pixels that can be written per second is extremely high. The SLM optical system is also simpler in the sense that the illumination of the SLM is non-critical, while in a laser scanner the entire beam path has to be built with high precision. Compared to some types of scanners, in particular electrooptic and acoustooptic ones, the micromirror SLM can be used at shorter wavelengths since it is a purely reflective device.

In both references cited above the spatial light modulator uses only on-off modulation at each pixel. The input data is converted to a pixel map with one bit depth, i.e., with the values 0 and 1 in each pixel. The conversion can be done effectively using graphic processors or custom logic with area fill instructions.

In a previous application by the present inventor Sandström (Sandström et al., EP 0 467 076, 1990), the ability to use an intermediate exposure value at the boundary of a pattern element to fine-adjust the position of the element's edge in the image created by a laser scanner was described.

Creation of a gray-scale image is also known in the art, preferably for projection display of video images and for printing. The is done with an SLM by variation of the time a pixel is turned on or by printing the same pixel several times with the pixel turned on a varying number of times. The present invention devices a system for direct gray-scale generation with a spatial light modulator, with a special view to the generation of ultra-precision patterns. Important aspects in the preferred embodiments, are uniformity of the image from pixel to pixel and independence of exact placement of a feature relative to the pixels of the SLM and stability when focus is changed, either with intention or inadvertently.

Specifically there is a problem with the prior art pattern generation to provide adequate image resolution and fidelity.

SUMMARY OF THE INVENTION

It is therefore an object of the present invention to provide an method to provide an increased resolution and fidelity.

This object is achieved with the method according to the appended claims.

The method according to the present invention comprises the steps of providing a source for emitting electromagnetic radiation in the wavelength range from EW to IR, illuminating by said radiation a spatial light modulator (SLM) having multitude of modulating elements (pixels), projecting an image of the modulator on the workpiece, moving said workpiece and/or projection system relative to each other, further reading from an information storage device a digital description of the pattern to be written, extracting from the pattern description a sequence of partial patterns, converting said partial patterns to modulator signals, and feeding said signals to the modulator, further coordinating the movement of the workpiece, the feeding of the signals to the modulator and the intensity of the radiation, so that said pattern is stitched together from the partial images created by the sequence of partial patterns, where an area of the pattern is exposed at least twice with a change in at least one, and preferably at least two, of the following parameters between the exposures:

data driven to the SLM focus angular distribution of the illumination at the SLM pupil filtering polarization.

By using several different exposures, the exposures could be adapted for certain features and aspects in the pattern, and hereby an improved resulting pattern is obtained. Thus, the method according to the present invention concentrates in a stepwise manner on one difficulty in the pattern at a time.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 shows a number of pixel designs with the upper four pixels in an off state and the remaining five pixels turned on;

FIGS. 4*a,* 4*b,* 4*c,* 4*d,* 4*e,* 4*f,* and 4*g* show a schematic comparison between an SLM with deflecting mirrors and an SLM with deforming mirrors;

DETAILED DESCRIPTION OF THE PREFERRED EMBODIMENTS

Figure 1:
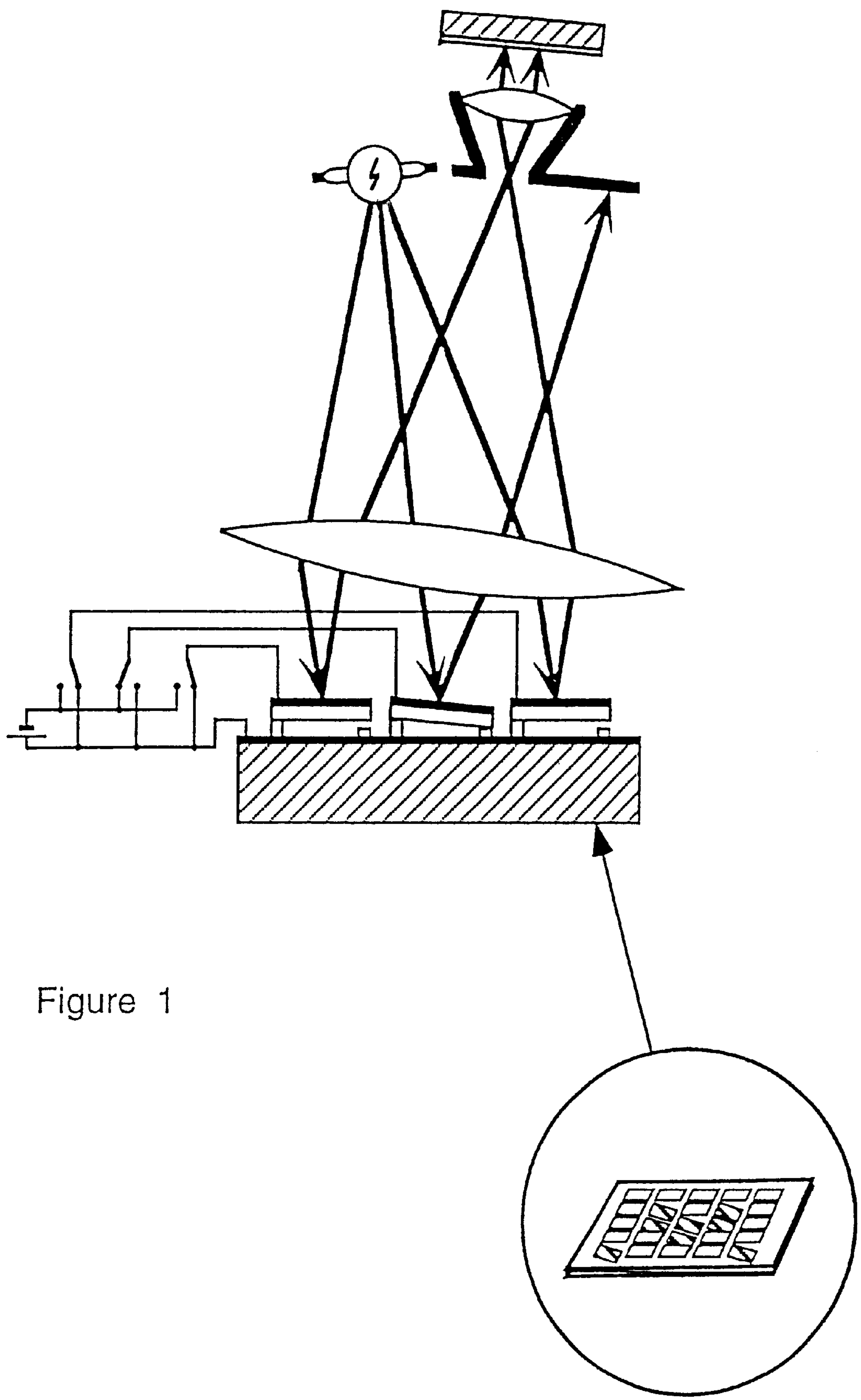
FIG. 1 shows a printer in prior art. The SLM consists of micromirrors that deflect the light from the lens pupil.

The basis for understanding the invention is the prior art generic arrangement in FIG. 1 which shows a generic projection printer with an SLM. Spatial light modulators based on reflection come in two varieties, the deflection type (Nelson) and the phase modulation type (Kück). The difference between them may in a particular case with micromirrors seem small. However, as shown in FIG. 1, the phase SLM extinguishes the beam in the specular direction by destructive interference, while with a deflection SLM, a pixel deflects the specular beam geometrically to one side so that it misses the aperture of the imaging lens as shown. For ultraprecise printing as performed in the current invention, the phase-modulating system as described by Kück 1990 is superior to the deflecting type. First, a phase modulation system has better contrast since all parts of the surface, including the hinges and support posts, take part in the destructive interference and total extinction can be achieved. By contrast, a deflection system works by deflecting the light to the side and is difficult to make symmetrical around the optical axis at intermediate deflection angles, creating a risk of feature instability when focus is changed. In the preferred embodiments, the phase modulation type is used. If, however, one accepts or designs around the asymmetry of the deflection type, a deflection system could also be used. This is illustrated schematically in FIG. 4. In FIG. 4*a,* a non-deflected micromirror 401 is illuminated, and the reflected light is not directed towards the aperture 402, and, hence, the light does not reach the substrate 403. In FIG. 4*b,* on the other hand, the mirror is fully deflected, and all the reflected light is directed towards the apperture. In an intermediate position only part of the reflected light will reach the substrate, which is shown in FIG. 4*c*. However, in this case the light is not symmetrical around the optical axis for the lens 404, and there is an oblique incidence on the substrate. A way to solve this problem is indicated by FIGS. 4*d–f.* Here, a first exposure is made with a first deflection angle for the micromirror, and thereafter a second exposure, preferably with the same light dose, is made for a second deflection angle, being complementary to the first angle. Hereby, the combination of the first and second exposure is symmetrical around the optical axis for the lens. Another way to solve the problem is to use deforming mirror 401', such as is shown in FIG. 4*g,* whereby the reflected light is evenly distributed over aperture. FIG. 4*g* schematically represents two cases, a phase type SLM (described below) or a deflection SLM, where light is reflected from different parts of the mirror.

The phase SLM can be built either with micromachined-mirrors, so called micromirrors, or with a continuous mirror surface on a supporting substrate that is deformed using an electronic signal. In Kück 1990, a viscoelastic layer controlled by an electrostatic field is used. However, but it is equally possible, especially for very short wavelengths where deformations of the order of a few nanometer are sufficient, to use a piezoelectric solid disk that is deformed by electric field or another electrically, magnetically or thermally controlled reflecting surface. For the remainder of this application an electrostatically controlled micromirror matrix (one- or two-dimensional) is assumed, although other arrangements as described above are possible, such as transmissive or reflecting SLMs relying on LCD crystals or electrooptical materials as their modulation mechanism, or micromechanical SLMs using piezoelectric or electrostrictive actuation.

Figure 2:
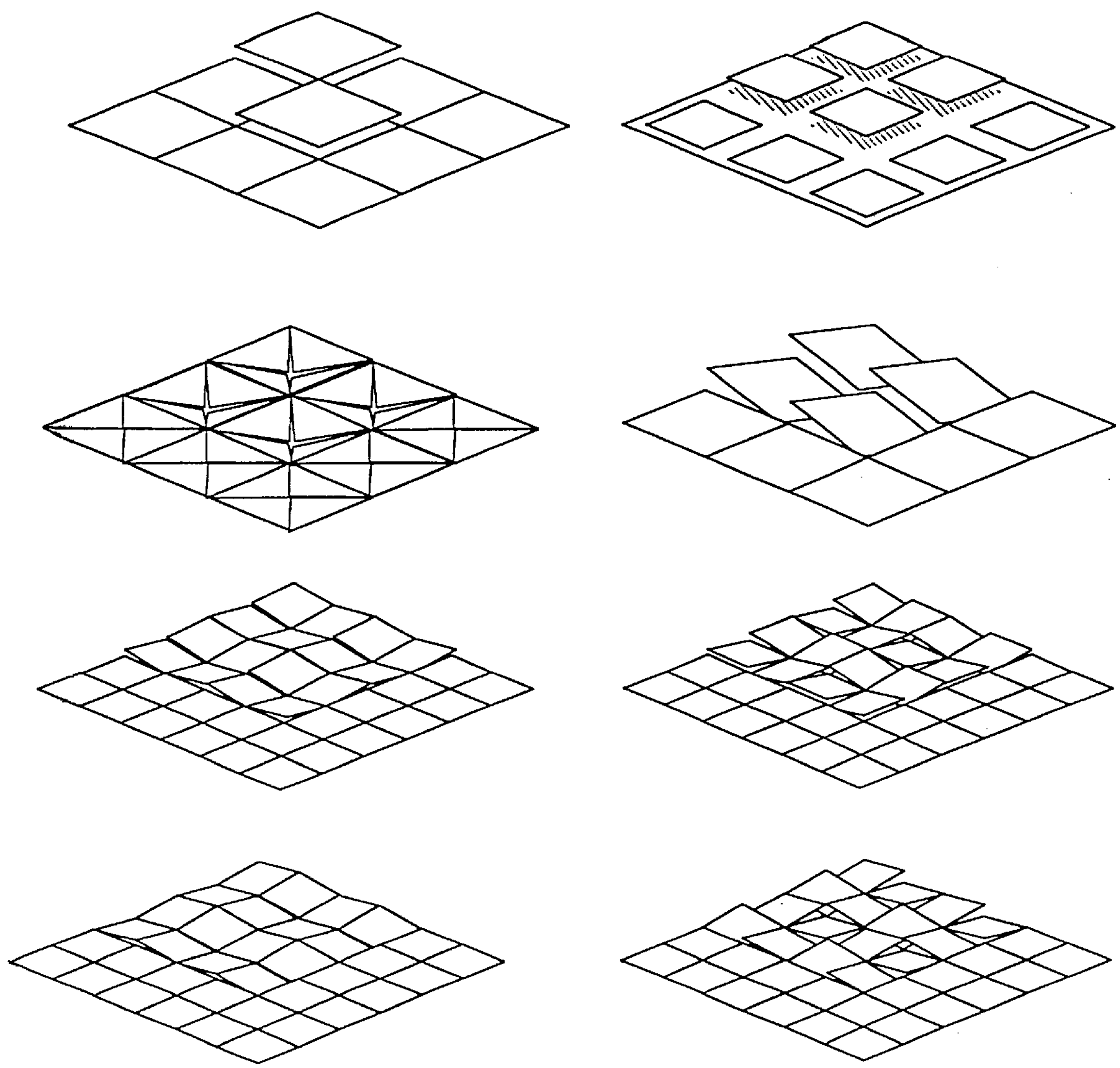

The present invention preferably uses a micromirror where the phase modulation is variable in order to obtain a variable amount of light reaching the pupil of the projection lens. FIG. 2 shows eight different multi-element. mirrors. The tilts of the various parts of the mirrors are unimportant. In fact, one element by itself would direct the light toward the lens while another would direct it outside of the pupil. The correct way to understand the function is to look at the complex amplitude reaching the center of the pupil from each infinitesimal area element of the mirror, and integrate the amplitude over the mirror. With a suitable shape of the mirror, it is possible to find a deformation where the complex amplitudes add up to almost zero, in which case no light reaching the pupil. This is the off-state of the micromirror. On the other hand, a relaxed state, where the mirror surface is flat and the complex amplitudes add in phase, is the on-state. Between the on and off-states, the amount of light in the specular direction is a continuous but non-linear function of the deformation.

The pattern to be written is normally a binary pattern, such as a photomask pattern in chrome on a glass substrate. In this context, binary means that there are no intermediate areas: a certain point on the photomask surface is either dark (covered with chrome) or clear (no chrome). The pattern is exposed in photoresist by the projected image from the SLM and the photoresist is developed. Modern resists have high contrast, meaning that a small percentage change in exposure makes the difference between full removal of the resist in the developer and hardly any removal at all. Therefore, the photoresist has an edge that is normally almost perpendicular to the substrate surface, even though the aerial image has a gradual transition between light and dark. The chrome etching further increases the contrast, so that the resulting image is perfectly binary: either opaque or clear, with no intermediate areas.

The input data is in a digital format describing the geometry of the pattern to be written on the surface. The input data is often given in a very small address units, e.g.: 1 nanometer, while setting pixels in the SLM to either on or off gives a much coarser pattern. If a pixel on the SLM is projected to a 0.1 $\mu$m pixel in the image, a line can only have a width that is an integer number of pixels (n*0.1 $\mu$m, where n is an integer). An address grid of 0.1 $\mu$m was enough until recently, but the advent of so-called optical proximity correction (OPC) makes a grid of 1–5 nanometers desirable. In OPC, the size of features in the mask are modified slightly to compensate for predicted optical image errors when the mask is used. As an example, when a mask with four parallel lines 0.8 $\mu$m wide is printed in a modern 4× reduction stepper (a projection printer for semiconductor wafers), they will typically print as lines 0.187, 0.200, 0.200, and 0.187 $\mu$m wide, although they were intended to have the same width. This can be predicted by simulating image formation, and the user of the mask may use OPC to compensate in the mask. Therefore, the user wants the first and last lines in the mask to be 4*0.213=0.852 $\mu$instead of 0.800 $\mu$m. With an address grid of 0.1 $\mu$m, the user cannot make the correction, but with a 5 nm address grid or finer, such correction is possible.

Figure 5:
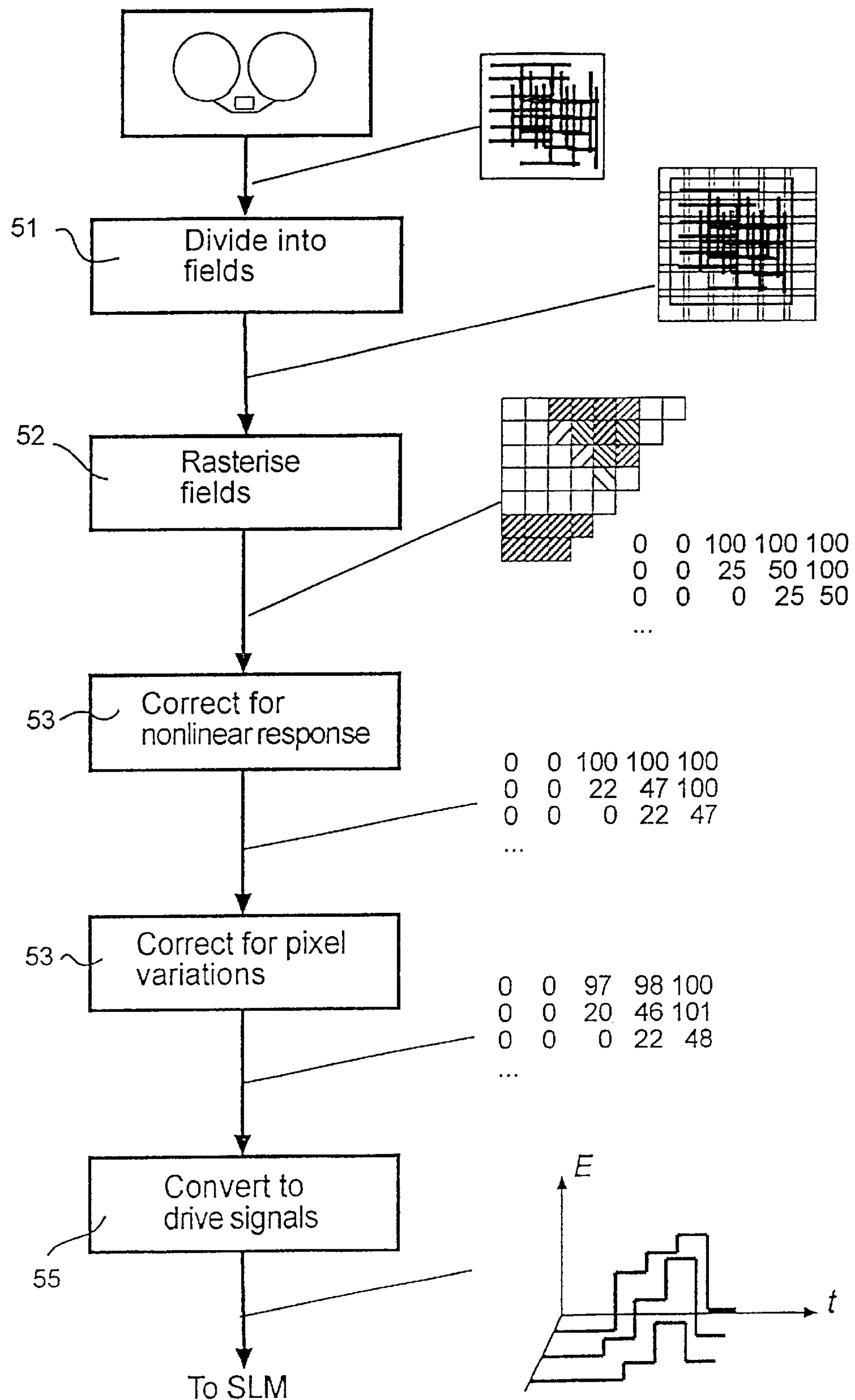
FIG. 5 shows a flow diagram of a method for translating and feeding data to the SLM.

In FIG. 5, the method for providing data for the SLM is shown in a flow diagram. The first step, S1, is to divide the pattern data for the pattern to be written into separate pattern fields. The pattern data is preferably received in digital form. Thereafter, in step S2, the fields are rasterized, and thereby assigned different exposure values. These values are then corrected for nonlinear response, step S3, and pixel-to-pixel variations, step S4. Finally, the pixel values are converted to drive signals and forwarded to the SLM.

The invention preferably uses intermediate values between the off-state and on-state to create a fine address grid, e.g., 1/15, 1/25, 1/50, of the size of a pixel. A printed feature consists of pixels in the on-state, but along the edge, it has pixels set to intermediate values. This is done by driving the pixels with voltages other than the on- and off voltages. Since there are several cascaded non-linear effects (for instance, the position of the edge versus exposure at the pixels at the boundary, the exposure vs. the deformation, and the deformation vs. the electric field), a non-linear transformation from the input data to the electric field is needed. Furthermore, this transformation is calibrated empirically at regular time intervals.

Figure 3:
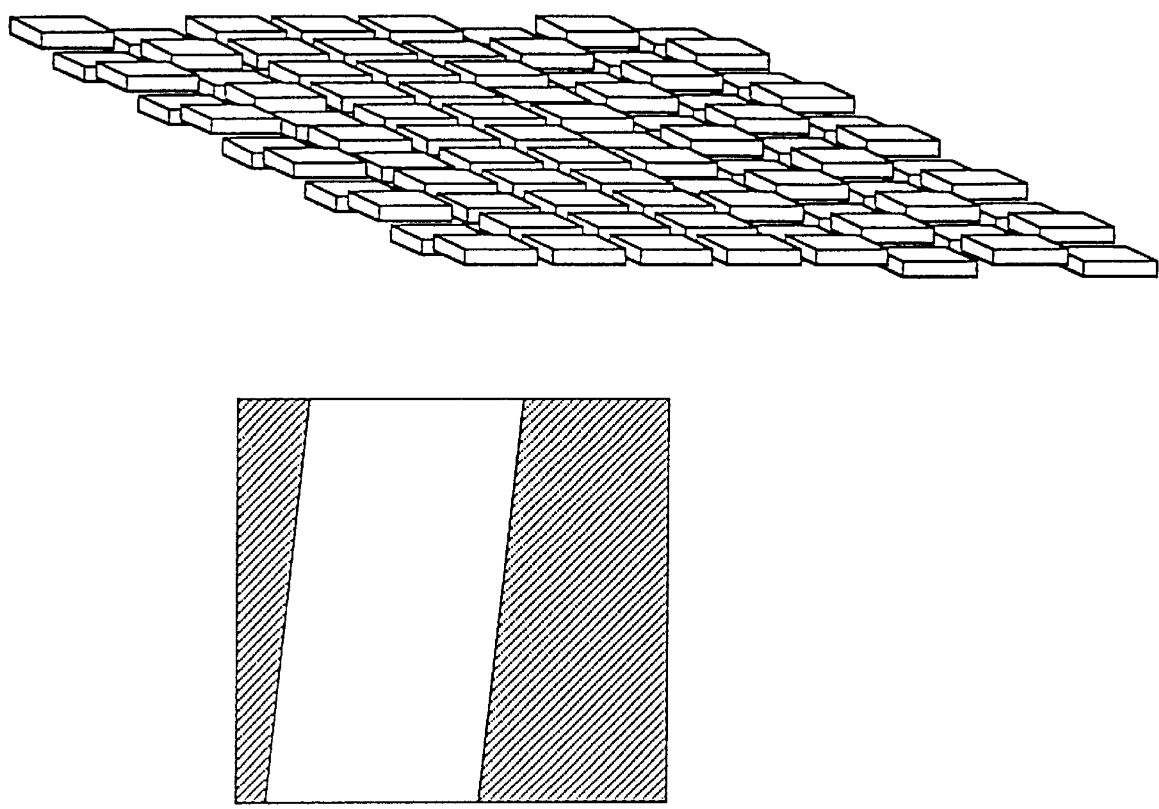
FIG. 3 shows an array of pixels moving up and down like pistons, thereby creating a phase difference. This is how an edge can be fine-positioned with a phase-type SLM.

FIG. 3 shows an array of pixels moving up and down like pistons, thereby creating a phase difference. The figure shows how the pixels are controlled to create the reflectivity in the inset. The bright areas have pixels with 0 phase, while dark areas are created by pixels with alternating +90 and −90 degree phases. The oblique boundaries between bright and dark areas are created by intermediate values of phase. This is how an edge can be fine-positioned with a phase-type SLM. However, other types of SLM with intermediate values could be used in the same manner. The imaging properties with the phase SLM driven into intermediate values are complex, and it is far from obvious that the edge will be moved in FIG. 3. However, it has been shown by extensive theoretical calculations and experiments by the inventor that the described effect is real.

The Design of the Phase-type SLM

A cloverleaf mirror design as used in prior art makes it possible to drive to intermediate states between on and off states. However, when the integrated complex amplitude is plotted as a function of deflection, it is seen that it never goes to zero completely, but hovers around zero, therefore having a non-zero minimum reflectivity with a varying phase angle. A thorough analysis of an image with some pixels set to intermediate states shows that the position of the edges in the final image is not stable through focus if the integrated phase angle of the edge pixels is not zero. In a preferred embodiment of the present invention, a new type of pixel with pivoting elements is used. When the elements pivot, one end moves toward the light source, and the other end away from it, the average phase keeping close to zero. Furthermore, the cloverleaf design has a problem of built-in stress created during fabrication. This stress tends to give a partial deformation without an applied electric field. The built-in deformation is not perfectly the same in every pixel, since it depends on imperfections during manufacturing. In the cloverleaf design, this difference from pixel to pixel creates a first-order. variation of reflectivity. With pixel cells built from pivoting elements, the same effect occurs, but gives a second-order effect. Therefore, the uniformity of the projected image is better.

Image Enhancements

There is a third advantage with a pivoting design. Specifically, the cloverleaf does not reach full extinction, a pivoting cell can more easily be given a geometry that gives full extinction, or even goes through zero and comes back to a small non-zero reflection, but with reversed phase. With better extinction there is greater freedom to print overlapping exposures, and designing for a small negative value gives better linearity close to extinction. Printing with a weak exposure, approximately 5%, in the dark areas, but with reversed phase can give an increased edge sharpness of 15–30% and the ability to print smaller features with a given lens. This is an analog to so-called attenuating phase-shifting masks that are used in the semiconductor industry. A related method of increasing the edge acuity is to set the pixels that are inside a feature a lower value and those near the edge a higher value. This gives a new type of image enhancement not possible with current projection of patterns from masks or by the use of projectors following Nelson and Kück. The combination of a non-zero negative amplitude in the background and an increased exposure along the edges need not conflict with the creation of a fine address grid by driving edge pixels to intermediate values, since the effects are additive or at least computable. When the pixels are substantially smaller than the feature to be printed a combination of pixel values exists, creating all effects simultaneously. To find them requires more computation than the generation of a fine address grid alone, but in some applications of the present invention the ability to print smaller features can have a high value that pays for the extra effort.

In the case of a continuous mirror on a viscoelastic layer, there is an inherent balancing of the average phase to zero. Simulations have shown that driving to intermediate values for fine positioning of feature edges also works for the continuous mirror. The non-linearities are smaller than with micromirrors. However, for the method to work well the minimum feature has to be larger than with micromirrors, i.e., have a larger number of addressed pixels per resolved feature element is needed. The causes the neeed for a larger SLM device, and for given pattern, the amount of data is larger. Therefore, the micromirrors have been chosen in a first and second embodiment.

In present the invention a pixel with rotation-symmetrical deformation (at least two-fold symmetry, in a preferred embodiment four-fold symmetry) is used for two reasons: first, to give a symmetrical illumination of the pupil of the projection lens, and second, to make the image insensitive to rotations. The latter is important for printing a random logic pattern on a semiconductor wafer. If there is an xy asymmetry, the transistors laid-out along the x axis will have a different delay from those along the y axis, and the circuit may malfunction or can only be used at a lower clock-speed. The two requirements of image consistency through focus and symmetry between x and y makes it very important to create and maintain symmetries in the optical system. Symmetry can be either inherent or it can be created by deliberate balancing of asymmetric properties, such as using multiple exposures with complementary asymmetric properties. However, since multiple exposures lead to reduced throughput, inherent symmetrical layouts are strongly favored.

The present invention preferably uses several, or at least two, exposures for at least some area of the pattern, whereby a change in at least: one, and preferably at least two, of the following parameters are made between the exposures:

data driven to the SLM focus angular distribution of the illumination at the SLM pupil filtering polarization.

For example, one exposure could have a higher exposure dose and create a pattern at the workpiece, and the second exposure have a lower exposure dose, an essentially inverse modulation at the SLM and a pupil filter, reducing the optical resolution at the workpiece. Alternatively, the exposures could have essentially the same exposure dose and a directional pupil filter (e.g., elliptical, rectangular or wedge shaped), could be rotated between the exposures. Also, the pattern data driven to the SLM could have a directional asymmetry, the asymmetry being rotated between the exposures, or further, the polarization of the light impinging on the workpiece could be rotated between the exposures.

If at least two of the following parameters are changed between the exposures:

data driven to the SLM angular distribution of the illumination at the SLM pupil filtering polarization, their directional properties could be rotated between the exposures, the rotation being synchronized between the at least two parameters.

Figure 7A:
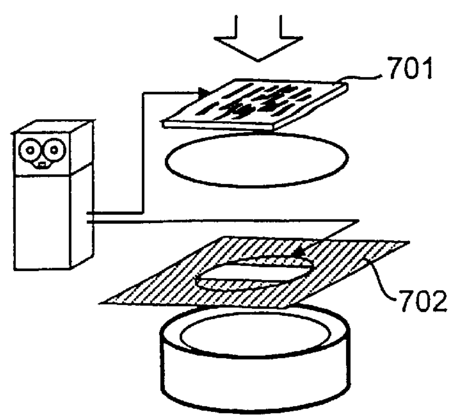
FIGS. 7*a* and 7*b* schematically show how the method according to the invention could be used for image enhancement by writing different types of features in the pattern in different exposures.
Figure 7B:
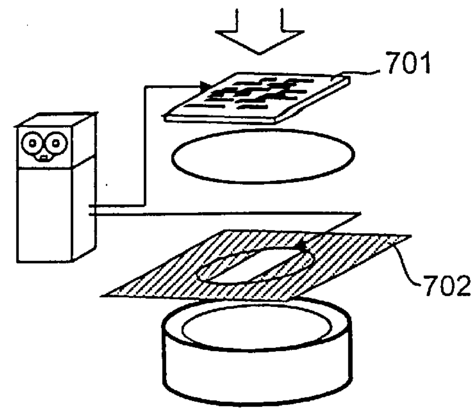

In FIGS. 7*a* and 7*b*, shown schematically are how two exposures with different (rotated) properties could be used to acheive a pattern with increased resolution. Here, the first exposure is directed to writing features in one direction, whereas the second exposure is directed to writing features in an perpendicular direction. In FIG. 7*a*, data for pattern features in a first direction are sent to the modulator 701, and the filter is rotated to a direction most suitable for these pattern features. Thereafter pattern features in the second direction is driven to the modulator, and the filter is rotated to a perpendicular direction (FIG. 7*b*).

Figure 8A:
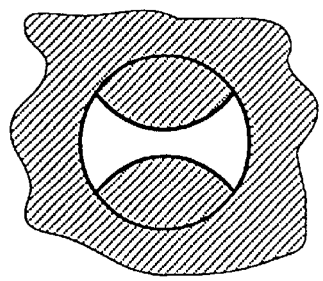
FIG. 8 shows an example of preferred pupil filter to be used in the present invention.
Figure 8B:
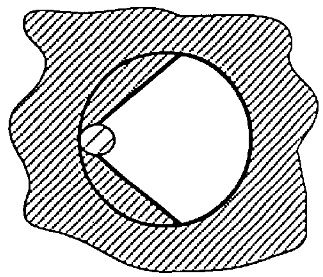
Figure 8C:
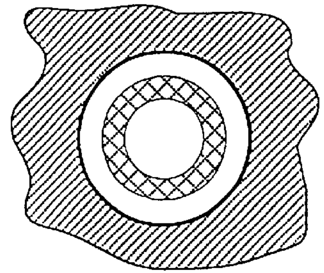

Preferably, the pupil filter used according to the present invention has a dogbone shape for the writing of patterns with narrow parallel) lines. Such a filter is shown in FIG. 8*a*. Further, the pupil filter could have an area for attenuating the spatial component of the light corresponding to large features in pattern, shown in FIG. 8*b*. Such a filter is preferably used for oblique illumination. The pupil filter could also be a secondary spatial light modulator. This secondary SLM, or a tertiary SLM, could also be used to control the angular distribution of the illumination at the primary SLM, creating a fully software driven implementation of the present invention. Finally, FIG. 8*c* shows an example of a filter with a phase shifting inner circle, used for improved resolution.

Figure 9:
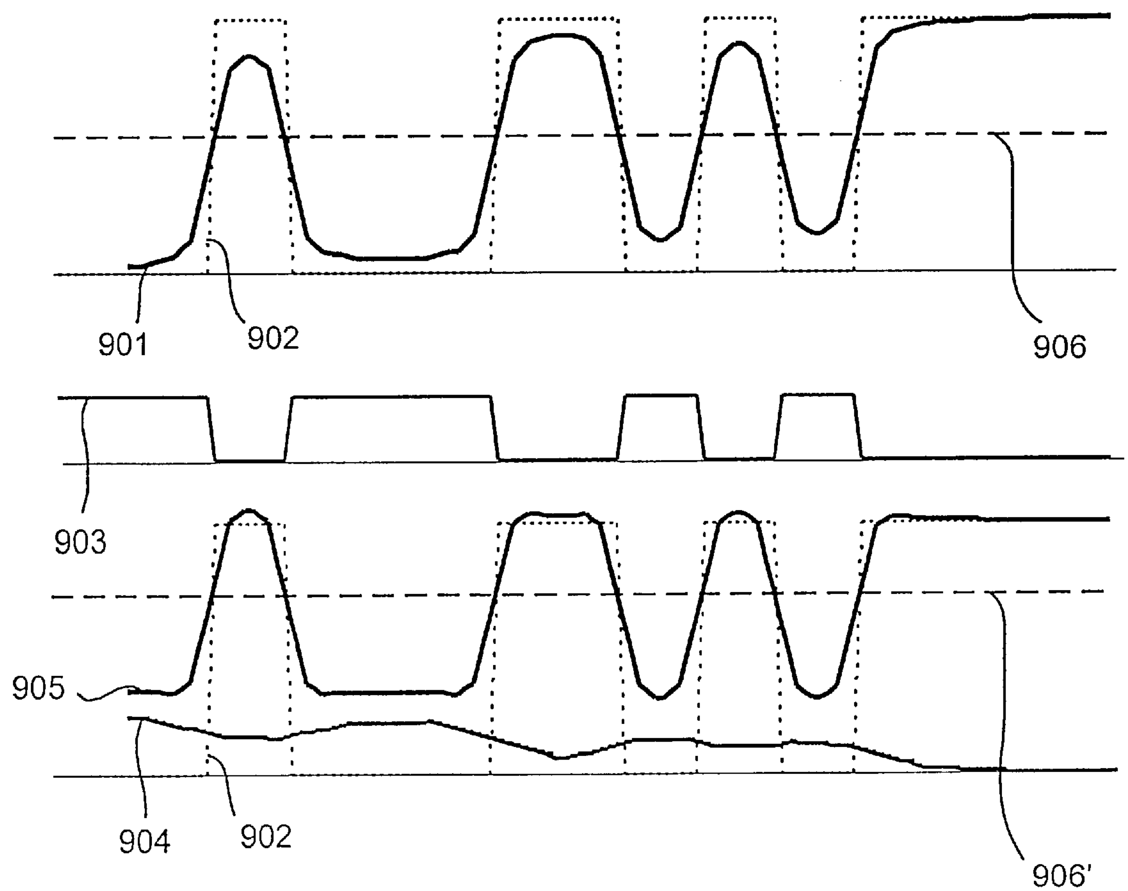
FIG. 9 shows a first schematic example of how a correction exposure could be used for increasing the resolution of the first exposure.
Figure 10:
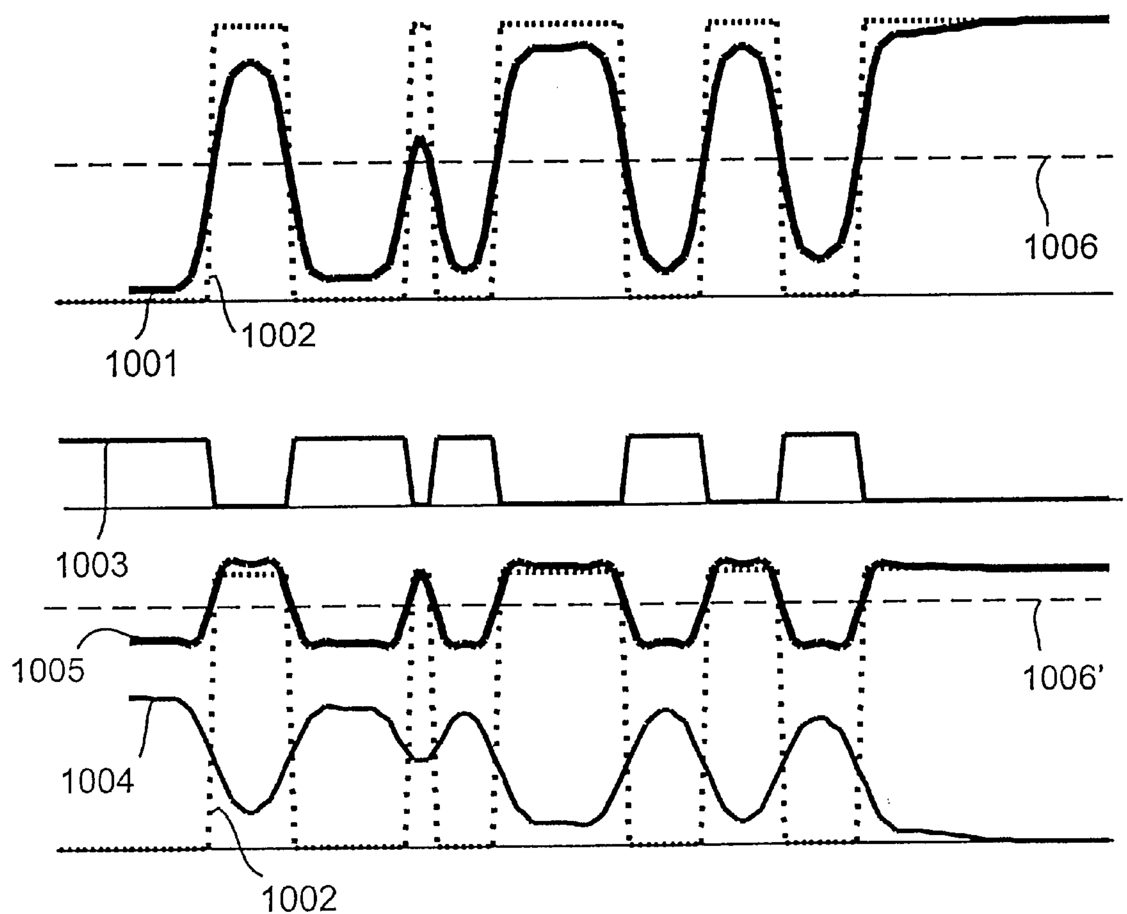
FIG. 10 shows a second schematic example of how a correction exposure could be used for increasing the resolution of the first exposure.

FIG. 9 shows how the data used in the second exposure could be adapted to increase the image resolution. In the first exposure, the curve 901 is written. In this case, a significant deviation between the intended pattern to be written, indicated by the dashed line 902, and the curve 901 actually written. The top levels varies, especially for narrow features, making the size of the features difficult to control. In the second exposure inverse data are used, as is shown for the curve 903. However, in this case, a smoothening filter is used for the second exposure, making the curve actually written to be curve 904. Together with the first exposure, the illumination curve will now look like the curve 905, where the top levels are essentially the same for all the printed features. By using a higher processing limit for the development process, indicated by the dashed lines 906 and 906', the resolution in the pattern is hereby significantly increased. However, the contrast is at the same time lowered, and there must be a trade-off between the contrast and the resolution. For patterns with very narrow features, indicated by the dotted line 1002 in FIG. 10, the difference between the curve 1001 written in the first exposure and the intended pattern are even more significant. In this case an inverse pattern 1003 with less smoothening is written in the second exposure, indicated by 1004. Hereby the resolution is improved even for very small features, but again at the cost of a deteriorated contrast, as indicated by the processing limits 1006 and 1006', respectively.

Preferred Embodiments

A first preferred embodiment is a deep-UV pattern generator for photomasks using an SLM of 2048×512 micromirrors. The light source is an KrF excimer laser with a pulsed output at 248 nanometers, pulse lengths of approximately 10 ns and a repetition rate of 500 Hz. The SLM has an aluminum surface that reflects more than 90% of the light. The SLM is illuminated by the laser through a beam-scrambling illuminator and the reflected light is directed to the projection lens and further to the photosensitive surface. The incident beam from the illuminator and the exiting beam to the lens are separated by a semitransparent beam-splitter mirror. Preferably the mirror is polarization-selective and the illuminator uses polarized light, the polarization direction of which is switched by a quarter-wave plate in front of the SLM. For x and y symmetry at high NA the image must be symmetrically polarized and a second quarter-wave plate between the beam-splitter and the projection lens creates a circularly polarized image. A simpler arrangement when the laser pulse energy allows it is to use a non-polarizing beam splitter. The quarter-wave plate after the second pass through the beam splitter is still advantageous, since it makes the design of the beam-splitting coating less sensitive. The simplest arrangement of all is to use an oblique incidence at the SLM so that the beams from the illuminator and to the projection lens are geometrically separated, as in FIG. 1.

The micromirror pixels are 20×20 $\mu$m and the projection lens has a reduction of 200X, making on pixel on the SLM correspond to 0.1 $\mu$m in the image. The lens is a monochromatic DW lens with an NA of 0.8, giving a point spread function of 0.17 $\mu$m FWHM. The minimum lines that can be written with good quality are 0.25 $\mu$m.

The workpiece, e.g., a photomask, is moved with an interferometer-controlled stage under the lens and the interferometer logic signals to the laser to produce a flash. Since the flash duration is only 10 ns the movement of the stage is frozen during the exposure and an image of the SLM is printed, 204.8×51.2 μm large. Two milliseconds later the stage has moved 51.2 μm, a new flash is shot, and a new image of the SLM is printed edge to edge with the first one. Between the exposures the data input system has loaded a new image into the SLM, so that a larger pattern is composed of the stitched flashes. When a full column has been written, the stage advances in the perpendicular direction and a new row is started. Any size of pattern can be written in way, although the first preferred embodiment typically writes patterns that are 125×125 mm. To write this size of pattern takes 50 minutes, plus the time for movement between consecutive columns.

Each pixel can be controlled to 25 levels (plus zero), thereby interpolating the pixel of 0.1 μm into 25 increments of 4 nanometers each. The data conversion takes the geometrical specification of the pattern and translates it to a map with pixels set to on, off, or to an intermediate reflection. The data path must supply the SLM with 2048*512*500 words of data per second, in practice 524 Mbytes of pixel data per second. In a preferred embodiment, the writable area is maximally 230×230 mm, giving up to 230/0.0512=4500 flashes maximum in a column and the column is written in 4500/500=9 seconds. The amount of pixel data needed in one column is 9×524=4800 Mb. To reduce the amount of transferred and buffered data, a compressed format is used, similar to the one in Sandström at al. 1990, but with the difference that a pixel map is compressed instead of segments with a length and a value. A viable alternative is to create a pixel map immediately and use commercially available hardware processors for compression and decompression to reduce the amount of data to be transferred and buffered.

Even with compression, the amount of data in a full mask makes it highly impractical to store pre-fractured data on disk, but the pixel data has to be produced when it is used. An array of processors rasterizes the image in parallel into the compressed format and transfers the compressed data to an expander circuit feeding the SLM with pixel data. In a first preferred embodiment, the processors rasterize different parts of the image and buffer the result before transmitting it to the input buffer of the expander circuit.

A Second Preferred Embodiment

In a second preferred embodiment, the laser is an ArF excimer laser with 193 nm wavelength and 500 Hz pulse frequency. The SLM has 3072×1024 pixels of 20*20 μm, and the lens has a reduction of 333X, giving a projected pixel of 0.06 μm. There are 60 intermediate values, and the address grid is 1 nanometer. The point spread function is 0.13 μm, and the minimum line 0.2 μm. The data flow is 1572 Mbytes/s, and the data in one column 230 mm long is 11.8 Gb.

A Third Embodiment

A third preferred embodiment is identical to the second embodiment, except that the matrix of pixels is rotated 45 degrees and the pixel grid is 84 μm, giving a projected pixel spacing along x and y of 0.06 μm. The laser is an ArF excimer laser, and the lens has a reduction of 240. Because of the rotated matrix, the density of pixels in the matrix is less, and the data volume is half of the previous embodiment. Nonetheless, the address resolution is the same.

Laser Flash-to-flash Variations

The excimer laser has two unwanted properties, flash-to-flash energy variations of 5% and flash-to-flash time jitter of 100 ns. In the preferred embodiments, both are compensated for in the same way. A first exposure is made of the entire pattern with 90% power. The actual flash energy and time position for each flash are recorded. A second exposure is made with nominally 10% exposure, with the analog modulation used to make the second exposure 5–15%, depending on the actual value of the first exposure. Likewise, a deliberate time offset in the second exposure can compensate for the time jitter of the first exposure. The second exposure can fully compensate for the errors in the first exposure, but will itself result in new errors of the same type. Since it is only on average 10% of the total exposure, both errors are effectively reduced by a factor of ten. In practice, the laser has a time uncertainty that is much larger than 100 ns, since the light pulse comes after a delay from the trigger pulse, and this delay varies by a couple of microseconds from one time to another. Within a short time span, the delay is more stable. Therefore, the delay is measured continuously, and the last delay values, suitably filtered, are used to predict the next pulse delay and to position the trigger pulse.

It is possible to make corrections for stage imperfections in the same way, namely, if the stage errors are recorded and the stage is driven with a compensating movement in the second exposure. Any placement errors that can be measured can, in principle, be partially or fully corrected in this way. It is necessary to have a fast servo to drive the stage to the computed points during the second exposure. In prior art, the SLM is self-mounted on a stage with small stroke and short response time and used for fine positioning of the image. Another equally useful scheme is to use a mirror with piezoelectric control in the optical system between the SLM and the image surface, the choice between the two being made based on practical considerations. It is also possible to add a position offset to the data in an exposure field, to thereby move the image laterally.

The second exposure is preferably taken with an attenuating filter between the laser and the SLM so that the full dynamic range of the SLM can be used within the range 0–15% of the nominal exposure. With 25 intermediate levels, it is possible to adjust the exposure in steps of 15%*1/25=0.6%.

The response varies slightly from pixel to pixel due to manufacturing imperfections, and possibly from aging also. The result is an unwanted inhomogeneity in the image. Where image requirements are very high, it may be necessary to correct every pixel by multiplication, wherein the pixels inverse responsiveness is stored in a lookup memory. Even better is the application of a polynomial with two, three, or more terms for each pixel. This can be done in the logic of the hardware that drives the SLM.

In a more complex preferred embodiment, several corrections are combined into the second corrective exposure: the flash-to-flash variation, flash time jitter, and also the known differences in the response between the pixels. As long as the corrections are small, i.e., a few percent in each they will add approximately linearly, therefore the corrections can be simply added before they are applied to the SLM. The sum is multiplied with the value desired exposure dose in that pixel.

Alternative Illumination Sources

The excimer laser has a limited pulse repetition frequency (prf) of 500–1000 Hz, depending on the wavelength and type of the laser. This gives large fields with stitching edges in both x and y axes. In two other preferred embodiments, the SLM is illuminated with a pulsed laser with much higher prf, e.g., a Q-switched, upconverted solid state laser, and with a continuous laser source scanned over the surface. of the SLM, so that one part of the SLM is reloaded with new data while another part is printed. In both cases the coherence properties of the lasers are different from the excimer laser and a more extensive beam-scrambling and coherence control is needed, e.g., multiple parallel light paths with different path lengths. In some implementations of the invention the light output from a flash lamp is sufficient and can be used as the light source. Advantages are low cost and good coherence properties.

In the preferred embodiment with scanning illumination two issues are resolved. First, the pulse-to-pulse variation in time and energy is improved, since the scanning is done under full control preferably using an electrooptic scanner such as acoustooptic or electrooptic, and second, many continuous laser have less power fluctuation than pulsed lasers. Furthermore the use of continuous lasers gives a different selection of wavelengths. Also, continuous lasers are less dangerous to the eye than pulsed lasers. Most important, however, is the possibility of reaching much higher data rates with a matrix with only a few lines, since the scanning is non-critical and can be done with a 100 kHz repetition rate or higher. Scanning the illumination beam is also a way of creating a very uniform illumination, which is otherwise difficult.

In some embodiments it is possible, and feasible, to use a flash lamp as the illumination source.

Extreme Ultraviolet Devices

Light sources for extreme ultraviolet (EUV) are based on radiation from a particle accelerator, a magnetic plasma pinch machine, or by the heating of a small drop of matter to extreme temperatures with a high-power laser pulse. In either case the radiation is pulsed. The EUV radiation propagates only in vacuum and can only be focused by reflective optics. A typical pattern generator using an SLM has a small exposure field and a modest requirement of optical power. The design of the optical system is therefore relaxed compared to that of an EW stepper, making it possible to use more mirrors and go to higher NA than in a stepper. It is anticipated that a high-NA lens will have a ring-shaped exposure field, and it is fully possible to adapt the shape of the SLM to such a field. With a wavelength of 13 nm and an NA of 0.25 it is possible to expose lines that are only 25 nm wide, and, using image enhancement as described below, even below 20 nm. No other known writing technology can match this resolution and at the same time achieve the writing speed that is made possible by the parallel character of an SLM.

Edge Overlap

Since a two-dimensional field is printed for each flash and the fields are stitched together edge to edge to edge, the stitching is very critical. A displacement of only a few nanometers of one field will create pattern errors along that edge that are visible and potentially detrimental to the function of an electronic circuit produced from the mask. An effective way of reducing the unwanted stitching effects is to print the same pattern in several passes, but with a displacement of the stitching boundaries between the passes. If the pattern is printed four times the stitching error will occur in four positions, but with only one-fourth of the magnitude. In a preferred embodiment of the present invention, the ability to create intermediate exposures is used together with an overlap band between the fields. The values are computed during the rasterization, although it could also be done during the expansion of the compressed data. Edge overlap reduces the stitching errors with much less throughput penalty than multipass printing.

Modified Illumination

In the first preferred embodiment, the illumination of the SLM is done by an excimer laser and a light scrambler such as a fly-eye lens array to create an illumination that resembles that from a circular self-luminous surface in the pupil plane of the illuminator. In order to increase the resolution, when printing with a specific projection system, it is possible to use a modified illumination. In the most simple cases, pupil filters are introduced in the pupil plane of the illuminator, e.g., with a quadrupole-shaped or annular transmission area. In a more complex case the same field is printed several times. Several parameters can be made to vary between the exposures, such as focus in the image plane, illumination pattern, data applied to the SLM, and pupil filter in the pupil plane of the projection optics. In particular the synchronized variation of the illumination and a pupil filter can give an increased resolution, most notably if the pupil has and a sector-shaped transmitting area, and the illumination is aligned so that the non-diffracted light intercepts an absorbing stop near the apex of the sector.

Linearization of the Response

There are essentially three approaches for linearization of the transfer function from data to edge placement:

- taking the non-linearity into account in the data conversion unit, and generating an 8 bit (example) pixel values. in the data conversion unit, and using digital-to-analog converters (DACs) with the same resolution to drive the SLM.
- to generate digital values with fewer values, e.g., 5 bits or up to 32 values, and translate them to an 8 bit value in a look-up table (LUT), and then feed the 8 bit values to the DACs.
- to use a 5 bit value and semiconductor switches to select a DC voltage that is generated by one or several high-resolution DACs.

In either case, it is possible to measure an empirical calibration function such that the response on the plate is linearized, when said function being applied at respectively the data conversion unit, the LUT or in the DC voltages.

Which linearization scheme to use depends on the data rate, the precision requirements and also on the available circuit technology that may change over time. At the present time the data conversion unit is a bottleneck and therefore it is not a preferred solution to linearize in the data conversion unit, neither to generate 8-bit pixel values. High-speed DACs are expensive and power-hungry. Thus, the most appropriate solution is to generate DC voltages and use switches. It is then possible to use even higher resolution than 8 bits.

Description of a Preferred Pattern Generator

Figure 6:
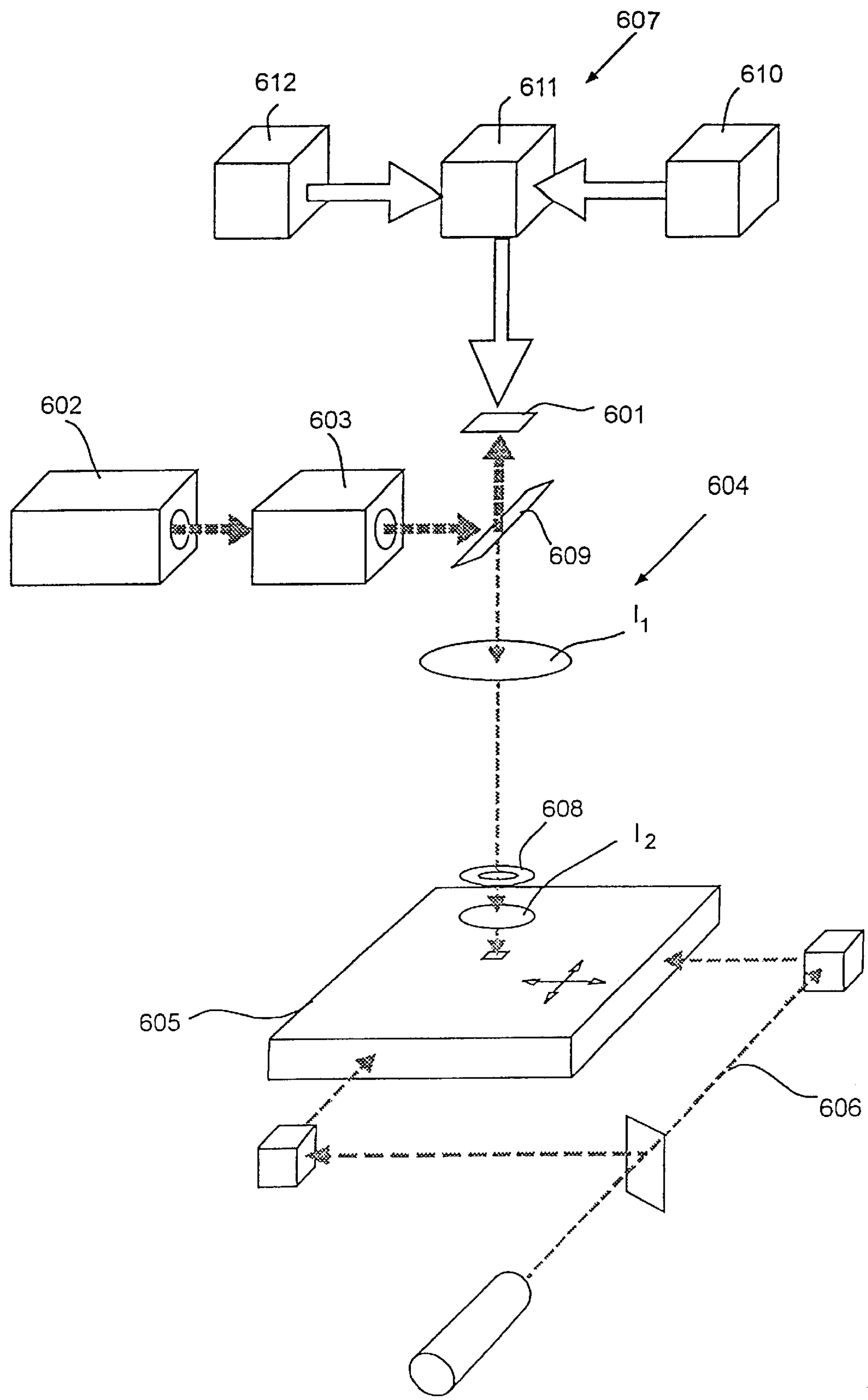
FIG. 6 shows a preferred embodiment of a pattern generator according to the invention.

Referring to FIG. 6, a pattern generator comprises an SLM 601 with individual and multi-value pixel addressing, an illumination source 602, an illumination beam scrambling device 603, an imaging optical system 604, a fine positioning substrate stage 605 with an interferometer position control system 606 and a hardware and software data handling system 607 for the SLM. For proper functionality and ease of operation it also contains a surrounding climate chamber with temperature control, a substrate loading system, software for timing of stage movement and exposure laser triggering to achieve optimum pattern placement accuracy, and a software user interface.

The illumination in the pattern generator is done with a KrF excimer laser giving a 10–20 nanoseconds long light flash in the UV region at 248 nanometer wavelength with a bandwidth corresponding to the natural line width of an excimer laser. In order to avoid pattern distortion on the substrate, the light from the excimer laser is uniformly distributed over the SLM surface and the light has a short enough coherence length not to produce laser speckle on the substrate. A beam scrambler is used to achieve two objectives. First, the beam scrambler divides the beam from the excimer laser in several beam paths with different path length, and second, it adds them together in order to reduce the spatial coherence length. The beam scrambler also has a beam homogenizes consisting of a lens system containing a set of fly-eye lenses that distributes the light from each point in the laser beam from the excimer laser uniformly over the SLM surface giving a "top-hat" light distribution.

The light from the SLM is relayed and imaged down to the substrate on the substrate stage. This is done using a Schlieren optical system described by Kück. A lens 11 with the focal width $f_l$ is placed at the distance fl from the SLM. Another lens 12 with the focal length fz is placed at the distance $2\times f_l+f_2$ from the SLM. The substrate is then at a distance $2\times f_l+2\times$fz from the SLM. At the distance $2\times f_1$ from the SLM there is an aperture 608 which size determines the numerical aperture (NA) of the system and thereby the minimum pattern feature size that can be written on the substrate. In order to correct for imperfections in the optical system and the substrate flatness, there is also a focal system that dynamically positions the lens 12 in the z direction with a position span of 50 micrometers to achieve optimal focal properties. The lens system is also wavelength corrected for the illuminating wavelength of 248 nanometers and has a bandwidth tolerance of the illuminating light of at least ±1 nanometer. The illuminating light is reflected into the imaging optical system using a beam splitter 609 that is positioned immediately above the lens 11. For a demagnification factor of 250 and an NA of 0.62 it is possible to expose pattern features with a size down to 0.2 micrometers with a good pattern quality. With 32 gray levels from each SLM-pixel the minimum grid size is 2 nanometers.

The pattern generator has a fine positioning substrate stage with an interferometer position control system. It consists of a moveable air bearing xy table 605 made of zerodur for minimum thermal expansion. A servo system with an interferometer position feedback measuring system 606 controls the stage positioning in each direction. In one direction, y, the servo system keeps the stage in fixed position and in the other direction, x, the stage moves with continuous speed. The interferometer position measuring system is used in the x-direction to trigger the exposure laser flashes to give uniform position between each image of the SLM on the substrate. When a full row of SLM images are exposed on the substrate, the stage moves back to the original position in the x direction, and further moves one SLM image increment in the y direction to expose another row of SLM images on the substrate. This procedure is repeated until the entire substrate is exposed.

The SLM images overlaps with a number of pixels in both the x and y direction, and the exposure data pattern is locally modified in the overlap pixels to compensate for the increased number of exposures that result in such overlap areas.

Variations in pulse to pulse intensity from the excimer laser is compensated by using two-pass exposure. of the pattern, whereby the first pass is done using a nominal 90% intensity of the correct intensity. In the first pass, the. actual intensity in each laser flash is measured and stored. In the second pass, the correct intensity for each SLM image exposure is then used based on the measured intensity values from the first pass. In this way, it is possible to reduce the influence from pulse-to-pulse intensity variations from the excimer laser by one order of magnitude.

The functionality of the SLM is described extensively elsewhere in this text. It has 2048×256 pixels, with a pixel size of 16 micrometers, and it is possible to address all pixels within 1 millisecond. The SLM is rigidly mounted in a fine stage. This fine stage is moveable 100 microns in the x and y directions, and has an accuracy better than 100 nanometers between each flash exposure. The fine positioning of the SLM is used to correct for position inaccuracy of the substrate positioning stage to further reduce pattern-stitching errors. In addition to the x-y positioning, there is also a rotational possibility of the SLM stage, in order to expose a pattern on a substrate with an angle other than the one specified by the substrate stage coordinate system. The purpose for such rotation is to create the possibility of incorporating substrate alignment feasibility for substrates with an already existing pattern where additional features shall be added. It is possible to measure the exact position of the substrate on the stage after loading it, using an off-line optical channel and a CCD camera to determine the system coordinates for a number of alignment marks existing on the substrate. During exposure, the stage position is then corrected in the x- and y-directions based on the measured positions of the alignment marks. Rotational alignment is achieved by using the stage servo system to follow the rotated coordinate system, and also rotating the SLM fine stage as described above.

An arbitrary data pattern of an arbitrary format is transformed into a compressed rasterized pixel map with 32 (5 bit) gray levels per pixel in a pattern rasterizer 610. Since the gray scale steps of an exposed pixel is not linear in response to the voltage applied to the pixel electrode, the input data is linearized in a pixel linearizer 611, so that the 32 gray levels correspond to a uniform increase in exposure dose for each successive level. This is done using 8-bit digital-to-analog converters (DAC) 612, whereby each gray level from the pixel map selects a voltage from the DACs according to a previously empirically calibrated linearization function. An additional offset in the choice of analog level from the DACs is made using a lookup table where each value corresponds to an SLM pixel and each such value corrects for anomalies of the corresponding pixel. The calibration values in the lookup table are generated using an empirical calibration procedure where a series of test patterns are sent to the SLM and the resulting exposed patterns are measured and used for individual pixel correction. This means that each gray level in the pixel map selects an analog voltage generating a pixel deformation for every corresponding SLM pixel to give the correct exposure dose.

The invention being thus described, it will be obvious that the same may be varied in many ways. Such variations are not to be regarded as a departure from the spirit and scope of the invention, and all such modifications as would be obvious to one skilled in the art to be included within the scope of the following claims.

What is claimed:

1. A method for creating a microlithographic pattern on a workpiece sensitive to radiation, for increased resolution and image fidelity, comprising the steps of:

providing a source for emitting electromagnetic radiation in the wavelength range from extreme ultraviolet (EUV) to infrared (IR), illuminating by said radiation a spatial light modulator (SLM) having a multitude of modulating elements (pixels), projecting an image of the modulator on the workpiece, moving said workpiece and/or projection system relative to each other, further reading from an information storage device a digital description of the pattern description a sequence of partial patterns, extracting from the pattern description a sequence of partial patterns, converting said partial patterns to modulator signals, and feeding said signals to the modulator, further coordinating the movement of the workpiece, the feeding of the signals to the modulator and the intensity of the radiation, so that said pattern is stitched together from the partial images created by the sequence of partial patterns, wherein an area of the pattern is exposed at least twice with a change in at least one, and preferably at least two, of the following parameters between the exposures:

data driven to the SLM focus angular distribution of the illumination at the SLM pupil filtering polarization.

2. A method according to claim 1, where one exposure has a higher exposure dose and creates a pattern at the workpiece, and the second exposure has a lower exposure dose, an essentially inverse modulation at the SLM and a pupil filter reducing the optical resolution at the workpiece.

3. A method according to claim 1, wherein exposures have essentially the same exposure dose and wherein a directional pupil filter is rotated between the exposures.

4. A method according to claim 1, where exposures have essentially the same exposure dose and where the pattern data driven to the SLM has a directional asymmetry and said asymmetry is rotated between the exposures.

5. A method according to claim 1, where exposures have essentially the same exposure dose and where the polarization of the light impinging on the workpiece is rotated between the exposures.

6. A method according to claim 1, where exposures have essentially the same exposure dose and where the focus is changed between the exposures.

7. A method according to claim 1, wherein at least two of the following parameters are changed between the exposures and said two changed parameters having a directional property:

data driven to the SLM angular distribution of the illumination at the SLM pupil filtering polarization, and said directional property is rotated between the exposures and the rotation is synchronized between the at least two parameters.

8. A method according to claim 1, wherein the pupil filter has a dog bone shape.

9. A method according to claim 1, where the pupil filter has an area for attenuating the spatial component of the light corresponding to large features in pattern.

10. A method according to claim 1, wherein the pupil filter is a secondary spatial light modulator.

11. A method according to claim 1, wherein the angular distribution of the illumination at the primary SLM is controlled by an illumination controlling SLM.

12. A method according to claim 3, wherein the directional pupil filter is elliptical.

13. A method according to claim 3, wherein the directional pupil filter is rectangular.

14. A method according to claim 3, wherein the directional pupil filter is wedge-shaped.

* * * * *